United States Patent

Hsue et al.

[11] Patent Number: 5,849,625
[45] Date of Patent: Dec. 15, 1998

[54] PLANAR FIELD OXIDE ISOLATION PROCESS FOR SEMICONDUCTOR INTEGRATED CIRCUIT DEVICES USING LIQUID PHASE DEPOSITION

[75] Inventors: Chen-Chiu Hsue; Gary Hong, both of Hsinchu, Taiwan

[73] Assignee: United Microelectronics Coporation, Taiwan

[21] Appl. No.: 807,885

[22] Filed: Feb. 26, 1997

Related U.S. Application Data

[63] Continuation of Ser. No. 596,790, Feb. 5, 1996, abandoned, which is a continuation of Ser. No. 351,493, Dec. 7, 1994, abandoned.

[51] Int. Cl.⁶ .................................................. H01L 2/76
[52] U.S. Cl. .................. 438/424; 438/433; 438/787; 438/782
[58] Field of Search ................................. 438/424, 433, 438/787, 782, 222; 148/DIG. 50

[56] References Cited

U.S. PATENT DOCUMENTS

| | | | |
|---|---|---|---|
| 4,539,744 | 9/1985 | Burton | 29/580 |
| 5,106,777 | 4/1992 | Rodder | 437/67 |
| 5,236,861 | 8/1993 | Otsu | 437/67 |
| 5,256,593 | 10/1993 | Iwai . | |
| 5,273,928 | 12/1993 | Tani . | |
| 5,330,928 | 7/1994 | Tseng . | |
| 5,453,395 | 9/1995 | Lur | 437/67 |
| 5,472,902 | 12/1995 | Lur . | |

OTHER PUBLICATIONS

Wolf, S. et al *Silicion Processing for the VLSIE Era* vol. 1, Lattice Press 1986, p. 22.
Wolf, S., *Silicon Processing for the VLSI Era* vol. 2, Lattice Press, 1990, p. 325.
"A Selective $SiO_2$ Film–Formation Technology using Liquid Phase Deposition for Fully Planarized Multilevel InterConnections", by T. Homma et al, J. Electrochen Soc. Vol 140, No. 8. Aug. 1993.

Primary Examiner—George R. Fourson
Attorney, Agent, or Firm—Rabin & Champagne, P.C.

[57] ABSTRACT

A process for fabricating an improved planar field oxide (FOX) structure on a silicon substrate was achieved. The process involves forming recessed areas in the silicon substrate where the field oxide is require. A thin silicon oxide is formed on the surface of the recessed areas as a nucleation layer and then a thicker silicon oxide layer is selectively deposited in the recess areas by Liquid Phase Deposition (LPD). The planar FOX structure formed by LPD can be used in conjunction with a FOX structure formed by the conventional LOCal Oxidation of Silicon (LOCOS) process on the same substrate. The planar field oxide formed by LPD eliminates the bird beak structure and the lateral diffusion of the channel stop implant commonly associated with the LOCOS structure.

15 Claims, 4 Drawing Sheets

PLANAR FIELD OXIDE ISOLATION PROCESS FOR SEMICONDUCTOR INTEGRATED CIRCUIT DEVICES USING LIQUID PHASE DEPOSITION

This is a continuation of application Ser. No. 08/596,790, filed Feb. 5, 1996 and now abandoned, which was a continuation of application Ser. No. 08/351,493, filed Dec. 7, 1994 and now abandoned.

BACKGROUND OF THE INVENTION (1) Field of the Invention

The present invention relates to the fabrication of integrated circuit devices on semiconductor substrates. More particularly, this invention is directed to a method for manufacturing planar field oxide isolation structures on semiconductor substrate.

(2) Description of the Prior Art

In recent years the device density on the semiconductor chip, from which integrated circuits are formed, as dramatically increased. This increase in device density is, in part, due to advances in high resolution photolithographic techniques and advances in directional plasma etching of the various conducting and insulating layers that form the submicrometer structures on and in the semiconductor substrate.

However, during the device fabrication, the accumulated effects of depositing and etching of patterns in these layers, one patterned layer on top of the other, can result in irregular or substantially nonplanar surfaces with micrometer and submicrometer feature sizes on an otherwise microscopically planar starting substrate.

These irregular surface features cause a number of process and reliability problems. For example, during plasma etching to pattern conducting layers, the directional or anisotropic etching can leave residue, often referred to as rails or stringers at the edges of the underlying surface irregularities. This results from the fact that conformal conducting layers formed over steps are thicker in the vertical direction on the sidewall of the underlying step than they are on the horizontal surface. The directionality of the plasma etching which etches predominantly in the vertical direction leaves residue from the conducting layer on the sidewalls of the step. This then results in electrical shorts between adjacent patterned conducting layers that are used to connect or wire up the various devices.

One commonly practiced method, used in the semiconductor industry, to circumvent this residue problem associated with the rough topography is to planarize the insulating layer over the patterned conducting layer, and thereby providing a planar surface for forming the next level of conducting patterned layers. Processing method that are commonly practiced include; bias sputter etching, etch back techniques, deposition of low flow temperature glasses, such as BPSG, spin-on-glass leveling techniques and mechanical/chemical polishing. However, most of these technique require additional processing steps that increase the manufacturing cost of the product.

More recently, a technique for forming planar dielectric layers by selective deposition of silicon dioxide ($SiO_2$) using Liquid-Phase Deposition (LPD) has been reported. See for example, the paper entitled "A Selective SiO2 Film-Formation Technology Using Liquid-Phase Deposition for Fully Planarized Multilevel Interconnections" by T. Homma et al J. Electrochem. Soc., Vol 140, No 8, August 1993. The paper describes a LPD method of using a saturated solution of hydrofluosilicic acid ($H_2SiF_6$) to selectively deposit, and thereby form a planar SiO2 insulator between a patterned electrically conducting tungsten layer.

Another region on the semiconductor substrate where rough topography can be a major processing problem is the patterning of polysilicon layers. For example, to form the field effect transistor (FET) in the device area and the word line over the Field OXide (FOX) area that surrounds the device area, such as is used on DRAMs, SRAMs, microprocessors, and other similar integrated circuit chips.

The conventional field oxide isolation is typically formed using a LOCal Oxidation of Silicon (LOCOS) process in which the device area is masked or protected from oxidation by a thin protective pad oxide and a thicker silicon nitride layer. The silicon substrate is then oxidized to form the field oxide layer having usually a thickness of between about 4500 to 5500 angstroms.

By the nature of this oxidation, the field oxide (FOX) which results in a volume expansion, approximately one half of the oxide thickness extends above the original substrate surface and about one half below the surface. When the silicon nitride layer and the pad oxide layer are removed from over the device area, and a polysilicon gate electrode is patterned over a thin gate oxide by photoresist masking and anisotropic etching, there remains on the edge of the field oxide pattern residual polysilicon which is difficult to remove without excessive over etching.

The reliability of conducting lines formed over such large steps in the underlying substrate is also of major concern. For example, thinning of the line or voids formed therein can be a source of electrical failure when the circuit is powered up.

One general approach in the semiconductor industry to circumvent these topographic problems, commonly taken to eliminate these problems, is to provide a planar surface on which the conducting layer is patterned. A method commonly used to form a planar field oxide, is to recess first the silicon substrate in the field oxide area by etching a trench and then growing a thermal oxide therein. Alternatively, the recess can be filled using a chemical vapor deposited (CVD) silicon oxide and then planarized, for example, by either chemical/mechanical polishing the CVD oxide to remove the raised portion of the CVD oxide. Another approach is to fill the recess with CVD oxide and then planarize the CVD oxide by applying a leveling material such as spin-on-glass (SOG) and etching back the SOG and the CVD to the substrate surface using a non-selective plasma etching. This later approach using a CVD oxide filled recess process is described by T. Otsu in U.S. Pat. No. 5,236,861. Another method for forming a planar thermal oxide in a recessed field oxide area is described by G. Burton in U.S. Pat. No. 4,539,744.

Although recessing the field oxide area and then filling with a deposited or thermally grown oxide, is a viable process, there are a number of concerns. For example, forming recesses in the single crystal silicon substrate having sharp corners and then forming a thick thermal oxide can lead to crystalline defects that can degrade device performance. Also the lateral oxidation, resulting in the formation of bird head and bird beak like structures in the field oxide, limits the design ground rules for fabricating Ultra Large Scale Integration (ULSI) circuits having submicrometer feature sizes. In addition, the process complexity is increased with increasing manufacturing costs. Therefore, there is a strong need to provide a simple and effective method for forming a planar field oxide.

SUMMARY OF THE INVENTION

It is the principle object of this invention to provide an improved planar field oxide (FOX) isolation structure being coplanar with the silicon substrate surface and without lateral oxidation occurring.

It is another object of the invention to provide this planar recessed field oxide (FOX) structure using the method of Liquid Phase Deposition of silicon dioxide.

It is still another object of the invention to provide a planarizing field oxide (FOX) process which is more cost effective for manufacturing than present methods.

In accordance with these objectives the invention teaches a new method for forming planar field oxide regions for electrically isolating the device areas on a silicon substrate and providing a planar surface upon which electrically conducting layers, having submicrometer feature sizes, can be patterned. The patterned conductive layer being free of residue at the edge of the underlying field oxide areas that would otherwise cause electrical shorts on a less planar surface.

The method begins by providing a semiconductor substrate having a principle surface that is planar, such as a single crystal silicon substrate having a <100> crystallographic orientation. In a first embodiment, the principle surface of the substrate is first coated with a photoresist layer and the photoresist is patterned leaving portions on the device areas and exposing the substrate surface in areas where the field oxide (FOX) is required. Using the photoresist as a mask, the substrate is then anisotropically etched forming recessed areas where the field oxide layer is required. A thin native oxide layer, about 20 Angstroms thick is formed in the recessed areas and function as a seed layer for selective deposition of the thicker patterned field oxide layer. With the photoresist layer still in place the bottom surfaces of the recessed areas are doped by ion implantation, thereby forming a channel stop layer.

The field oxide is now deposited by Liquid Phase Deposition (LPD), by immersing the substrate in a supersaturated solution of, for example, hydrofluosilicic acid made supersaturated by dissolving silicon oxide (SiO2) powder therein. Although the detail mechanism is not well understood, it is believed that a dehydration reaction occurs at the oxidized surface making the adsorption of siloxane (Si—O—Si) oligomers possible that results in the selective deposition of SiO2. The deposition is continued until the top surface of the field oxide is coplanar with the principle surface of the silicon substrate. The patterned photoresist layer is then removed from over the device areas, such as by plasma ashing in an oxygen ambient at low pressures, and thereby completing the planar FOX structure.

Field Effect Transistors (FETs) are then formed on the device areas and electrical conducting inter-connections are formed elsewhere on the substrate. First a thin gate oxide formed by thermally oxidation is grown on the device areas and then a doped polysilicon layer and an insulating layer are deposited thereon. The insulating layer and polysilicon layer are patterned by photolithographic means and plasma etching to form the gate electrodes of the FETs and the conducting interconnections. The FETs are then completed by forming the source/drain regions adjacent to the gate electrode, usually by ion implantation.

A second embodiment of the invention is similar to the first embodiment but incorporates a silicon nitride ($Si_3N_4$) or silicon oxide/silicon nitride layer to protect the device areas during the liquid phase deposition (LPD) of the field oxide (FOX). In this approach a silicon nitride layer is deposited on the principle surface of the substrate and then photolithographic means and plasma etching are used to pattern the silicon nitride layer leaving portions over the device areas and exposing the areas wherein the field oxide layer is to be formed. The silicon substrate is then etched anisotropically to the required depth for the recessed field oxide. The photoresist is removed by conventional means and a thin thermal oxide, about 50 to 200 Angstroms thick is grown on the surfaces of the recessed areas of the silicon substrate, while the silicon nitride layer forms a barrier to oxidation over the device areas. Now as in the first embodiment, a channel stop ion implant is performed in the bottom surface of the recessed areas and a liquid phase deposition (LPD) of silicon oxide is carried out to fill the recesses and form the planar field oxide. The silicon nitride layer is removed, such as etching in a hot phosphoric acid solution, and the FETs are completed as described in the first embodiment.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Now in keeping with the objects of this invention, the method of the first embodiment for forming a planar field oxide (FOX) structure by the selective deposition of silicon oxide using the method of Liquid Phase Deposition (LPD) is covered in detail. The method of this invention eliminates the problems typically associated with the conventional method of forming the field oxide by the LOCal Oxidation of Silicon (LOCOS) process, such as the formation of bird head and bird beak like structures on the field oxide. The LPD method also minimizes the lateral diffusion of the channel stop implanted dopant which can restrict further the ground rules for manufacturing ULSI circuits.

This planar field oxide structure is used to electrically isolate the active device areas for devices, such as field effect transistors (FETs) that are currently used in the manufacture of DRAMs, SRAM, microprocessor and other similar circuits.

Although the invention is described for use with FET device structures, it should be well understood by one skilled in the art that the planar field oxide structure can be used for other integrated circuit applications, such as isolation for bipolar circuits and the likes. Although the invention is shown for a P-doped substrate, for simplicity, it should also be understood that the invention equally applies to N-doped substrates and to substrates having N and P-wells from which CMOS circuits can be built.

Figure 1:
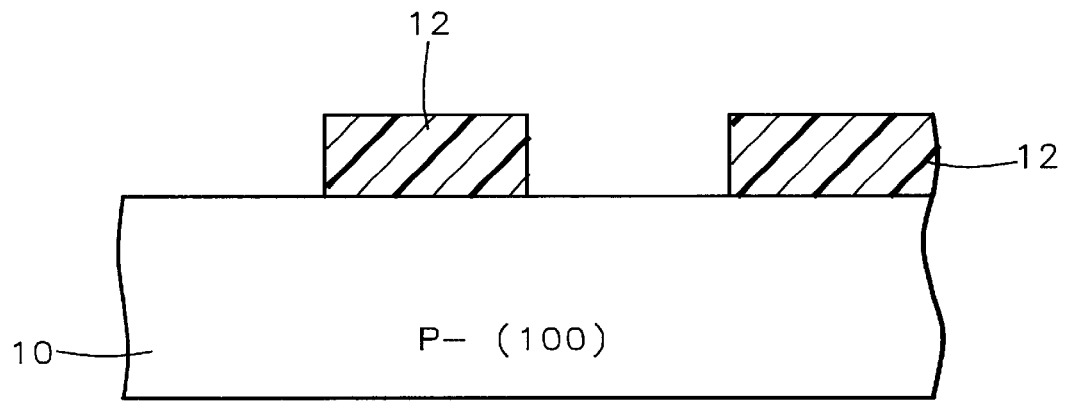
FIGS. 1 through 4 schematically illustrates in cross sectional representation the first embodiment of this invention, in which the planar field oxide is selectively formed by liquid phase deposition of silicon oxide using a photoresist mask.

Referring now to FIG. 1, a schematic cross-sectional view is shown of a substrate 10, composed of, for example, single crystalline silicon and having a <100> crystallographic orientation. A patterned photoresist layer 12 is spin coated on the principle surface of the substrate. The patterned photoresist layer 12 is formed by conventional lithographic techniques and is patterned to leave portions over the required device areas, while exposing the substrate surface in areas where the Field OXide (FOX) isolation is to be formed.

Figure 2:
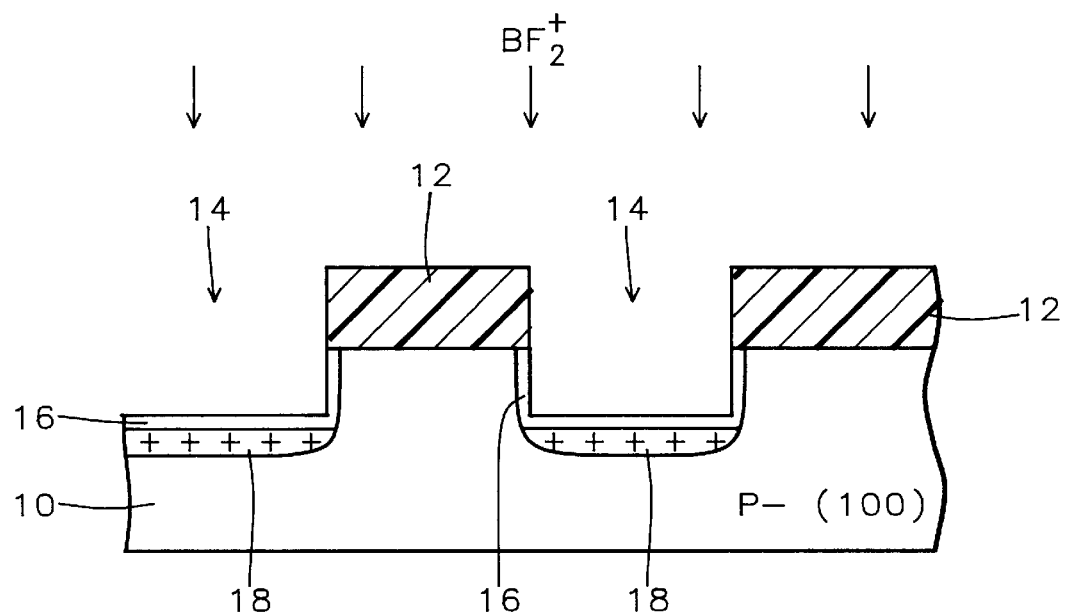

Now as shown in FIG. 2, the silicon substrate 10 is subjected to an anisotropically etch, and thereby forming in the substrate recessed areas 14 or trenches in which the field oxide isolation will be later be formed. The recessed areas 14 or trenches are typical formed by plasma etching at low pressure, such as in a reactive ion etcher (RIE), using any number of suitable reactive etch gas mixture that provide a low etch bias during etching. For example, gas mixtures, such as chlorine and argon or gases containing carbon difluorochloride ($CCL_2F_2$) can be used to achieve the directional etching. The preferred depth of the recessed area 14, depending on device requirements, can range in depth from between about 1000 to 6000 Angstroms.

A thin native oxide layer ($SiO_2$) 16 is then formed on the surface of the recessed area 14, as shown in FIG.2. For example, the oxide can be formed by immersing the substrate in a de-ionized water bath. The thickness of the naturally form oxide is generally about 20 Angstroms, and as will be seen later in this first embodiment serves the very important function of being the nucleation layer or seed layer for the selective deposition of the field oxide isolation layer by liquid phase deposition (LPD).

Still referring to FIG. 2, with the patterned photoresist layer 12 still in place and masking the device areas, the bottom surface of the recessed areas 14 are now doped by ion implantation. This field implant provides a channel stop doped layer 18, that prevent surface inversion from occurring which can lead to unwanted leakage currents when the integrated circuit is powered up during usage. The preferred dopant of layer 18 is boron and is usually formed by implanting boron difluoride ($BF_2^+$) ions, as depicted by the arrows in FIG. 2, The preferred implant dose is between about 5 E 11 to 1 E 13 atoms/$cm^2$ and more specifically having a dose of about 2 E 12 atoms/$cm^2$. The preferred ion implant energy is between about 30 to 100 Kev.

Figure 3:
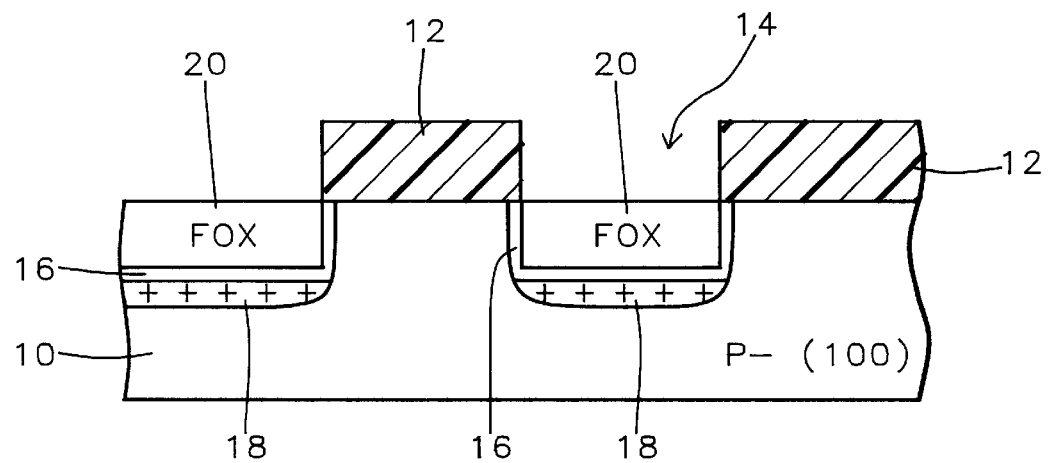

Referring now to FIG. 3, the liquid phase deposition (LPD) process is now used to selectively fill the recessed areas 14 in the silicon substrate 10 with silicon oxide, and thereby forming a field oxide (FOX) structure 20 having a top surface which is coplanar with the principle surface of the silicon substrate 10.

The liquid phase deposition of the silicon oxide is performed in a supersaturated solution of hydro-fluosilicic acid ($H_2SiF_6$). The method more specifically involves dissolving a pure silicon oxide power, such as formed by the sol-gel method from tetraethoxysilane (TEOS), in a $H_2SiF_6$ acid solution to form a saturated solution at about 25° C. For example, the hydrofluorsilicic acid being 40 percent by weight in aqueous solution is manufactured by the Morita Kagaku Kogyo Co. Ltd of Japan. The saturated solution is then transferred to a Teflon vessel for film deposition and maintained at a temperature of between about 33° to 37° C. by a water bath. The substrates are then immersed in the solution for liquid phase deposition (LPD). During the deposition an aqueous solution of boric acid ($H_3BO_3$) is continuously added by a controlled drip rate and magnetic stirring to maintain the supersaturated condition. The thin oxide layer 16 previously formed on the silicon recessed area provide the important function as the nucleating layer on which the siloxane oligemers selectively deposits.

As shown in FIG. 3, a timed liquid phase deposition (LPD) is used to selectively fill with the LPD silicon oxide the recessed area 14 to the principle surface of the substrate 10, and thereby forming the planar field oxide (FOX) structure 20. This improved FOX structure has several advantages over the more conventional local oxidation of silicon (LOCOS) process. For example, the birds beak structure is eliminated making more aggressive ground rule possible for ULSI applications. Also, the high temperature thermal cycles commonly used to form the field oxide by the LOCOS method is eliminated, resulting in a reduced lateral diffusion of the boron dopant from the channel stop implant, and thereby further improving the design ground rule while improving circuit performance by reducing the junction capacitance associated with channel stop implant. After filling the recesses with LPD silicon oxide, other techniques, such as etch back or chemical/mechanical polishing can be used to further planarize the oxide if required.

Figure 4:
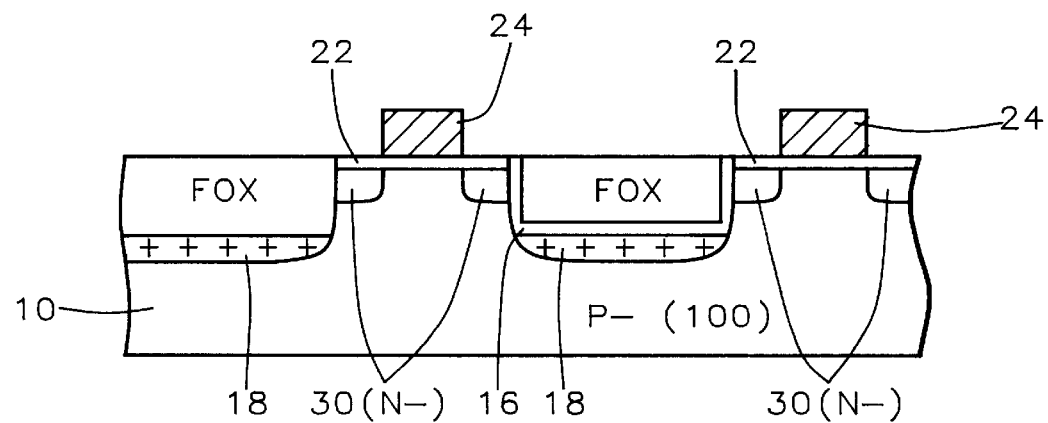

With reference to FIG. 4, a method is now described for fabricating a field effect transistor (FET) on the device area using the improved field oxide (FOX) isolation structure 20 of this invention. The photoresist, used as a mask during the liquid phase deposition, is now removed by conventional means, such as plasma ashing in an oxygen ambient at reduced pressures. A good quality gate oxide 22 is then grown on the device areas by thermal oxidation having a thickness of between about 50 to 200 Angstroms.

The gate electrode for the FET is now fabricated by depositing a polysilicon layer 24, which is either in situ doped during deposition or doped by ion implantation after the layer 24 is deposited undoped. Conventional means, such a low pressure chemical vapor deposition (LPCVD), are used to deposit layer 24. The preferred dopant is atomic arsenic or phosphorus having a concentration in the polysilicon layer 24 of between about 1 E 19 to 1 E 21 atoms/$cm^3$, and the preferred thickness of the layer 24 is between about 2000 to 5000 Angstroms. The doped polysilicon layer 24 is patterned by photolithography and etching to form the gate electrode. Source/drain areas 30 are formed by ion implantation, adjacent to and aligned to the gate electrode having an ion implant dose of between about 1 E 13 to 1 E 14 atoms/$cm_2$ and an ion implant energy of between about 20 to 40 Kev, and thereby completing the FET.

Although this invention is described for a field oxide (FOX) that can replace the more convention field oxide formed by the method of LOcal oxidation of Silicon (LOCOS), it should be well understood by those skilled in the art that the method of forming the field oxide by this invention can also be used in conjunction with the LOCOS method. For example, the LOCOS isolation structure can be incorporated on the substrate where the device ground rules are less restrictive and then the field oxide of this invention can be used where tighter design ground rules are required.

Referring now more specifically to FIGS. 5 through 8, a second embodiment of the invention is described. Since the second embodiment is similar to the first embodiment except for the introduction of a new insulating layer, the layers and structures labeled in the FIGS. 5 through 8 are the same as those labeled in FIG.1 through 4 of the first embodiment. Also, wherever the processes are similar, only a brief description is given in the second embodiment.

Figure 5:
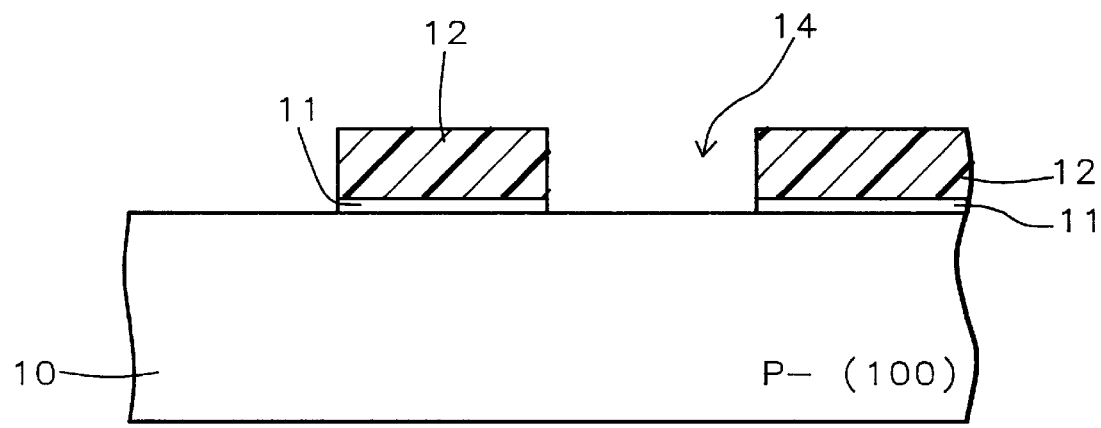
FIGS. 5 through 8 schematically illustrates in cross section representation the second embodiment of this invention. The planar field oxide is selectively formed by liquid phase deposition of silicon oxide using a silicon nitride mask to protect the device areas.

Referring still to FIG.5, the silicon substrate 10 is deposited with the new insulating layer 11 composed of silicon nitride. Alternatively, a pad oxide, composed of silicon oxide ( not shown in the FIG.) and being between about 100 to 500

Angstroms thick can be thermally grown on the substrate prior to depositing the silicon nitride layer 11. The silicon nitride layer 11 is preferably between about 500 to 2000 Angstroms thick and is deposited by LPCVD. A patterned photoresist layer 12, as detailed in the first embodiment is formed on layer 11 rather than on the substrate 10, and anisotropic plasma etching is used to pattern the silicon nitride layer, exposing the substrate area where the planar field oxide is to be formed.

Figure 6:
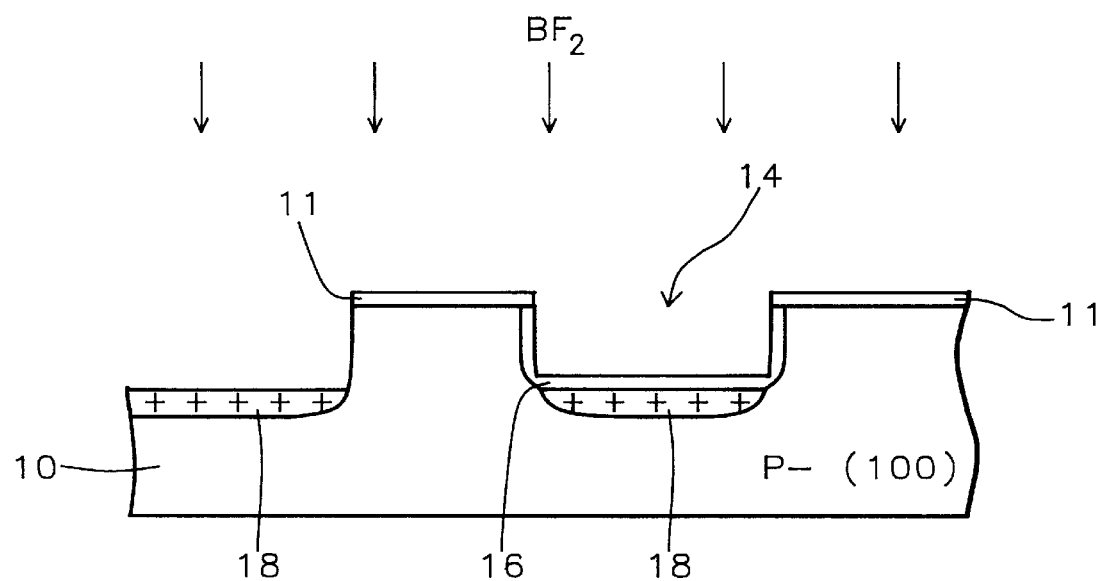

Referring now to FIG. 6, the photoresist layer 12 is stripped, and the a recessed area 14 is formed in the substrate 10 by anisotropic etching as detailed in the first embodiment. The silicon nitride layer 11 over and protecting the device areas providing as an etch mask. The boron channel stop layer 18 is now formed by implantation of $BF_2$ ions. A silicon oxide layer 16 is now formed on the surface of the recessed areas 14, either by forming a native oxide, as described in the first embodiment, or by thermal oxidation at elevated temperatures in an oxygen containing ambient. The second embodiment provide a means for growing a thicker oxide layer 16 since the photoresist layer 12 is removed. The preferred thickness is between about 50 to 200 Angstroms.

Figure 7:
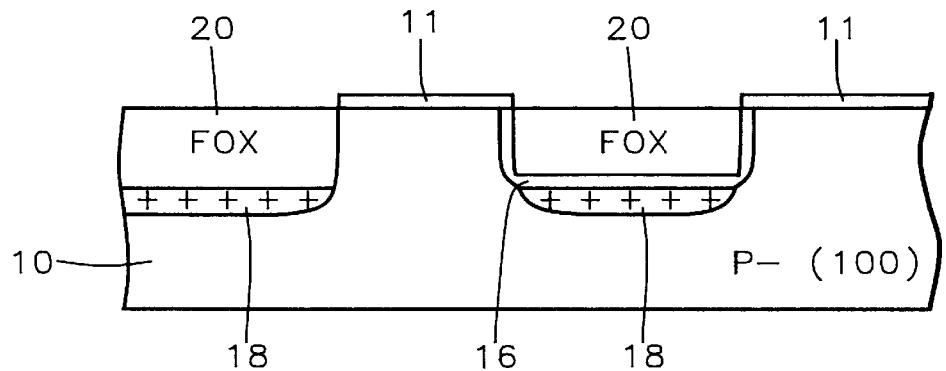

Referring now to FIG. 7, the recessed areas 14 in the substrate 10 are filled with a silicon oxide layer 20 by the method of liquid phase deposition (LPD) as detailed in the first embodiment. The thickness of the layer 20 is about equal to the depth of the recess. This forming a planar field oxide layer 20 having a top surface which is coplanar with the principle surface of the substrate, and thereby completes the planar field oxide insulation process for integrated circuit semiconductor devices.

Figure 8:
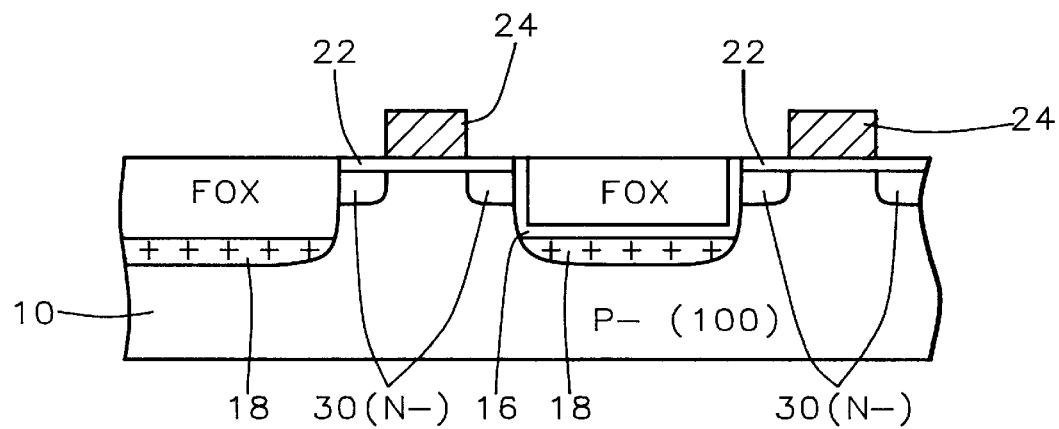

As shown in FIG. 8, the silicon nitride layer 11 is removed, for example, by etching in a hot phosphoric acid solution, and then the field effect transistor (FET) is formed as detailed in the first embodiment. Briefly, a gate oxide 22 is formed on the device areas. A doped polysilicon layer 24 is patterned by photolithography and etching to form the gate electrode. The lightly doped source/drain areas 30 are formed by implantation adjacent to and aligned to the gate electrode.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an integrated circuit device, comprising:

providing a semiconductor substrate having a surface;

forming trenches extending into the substrate, the trenches having trench surfaces recessed below the surface of the substrate;

immersing the trenches in water to form a seed layer of silicon oxide on the trench surfaces; and selectively depositing by liquid phase deposition silicon oxide within the trenches.

2. The method of claim 1, wherein the step of forming trenches comprises the steps of:

providing a trench etch mask over the surface of the substrate and exposing portions of the surface of the substrate where trenches are to be formed; and anisotropically etching the exposed portions of the substrate to form trenches in the substrate.

3. The method of claim 2, wherein the trench etch mask comprises photoresist.

4. The method of claim 2, wherein the trench etch mask comprises an insulator.

5. The method of claim 4, wherein the trench etch mask comprises silicon nitride.

6. The method of claim 1, further comprising the step of doping at least portions of the trench surfaces to form a channel stop layer.

7. The method of claim 6, wherein the channel stop layer is formed by ion implantation through the seed layer of silicon oxide.

8. The method of claim 1, wherein the semiconductor substrate is silicon.

9. The method of claim 1, wherein the trenches have a depth of between about 1000 to 6000 Angstroms.

10. The method of claim 2, wherein the step of anisotropically etching is performed in a reactive ion etcher having a reactive etch gas mixture comprising chlorine and argon.

11. The method of claim 1, wherein the seed layer of silicon oxide on the trench surfaces has a thickness of between about 20 to 30 Angstroms.

12. The method of claim 6, wherein the step of doping comprises ion implantation of boron fluoride ($BF_2^+$) ions to a dose of between about 5 E 11 to 1 E 13 ions/cm$^2$ with an ion implant energy of between about 30 to 100 KeV.

13. The method of claim 1, wherein the selectively deposited silicon oxide has a thickness equal to the depth of the trenches.

14. The method of claim 1, wherein the liquid phase deposition is performed from a supersaturated aqueous solution of hydrofluorsilicic acid ($H_2SiF_6$) and boric acid ($H_3BO_3$) at a temperature of between about 33° to 37° C.

15. The method of claim 1, wherein the aqueous solution of boric acid is added to the hydrofluorsilicic acid ($H_2SiF_6$) to maintain a supersaturated solution during the liquid phase deposition.

* * * * *